United States Patent
Drachuck et al.

(10) Patent No.: US 11,360,397 B2
(45) Date of Patent: Jun. 14, 2022

(54) SYSTEM AND METHOD FOR APPLICATION OF HARMONIC DETECTIVITY AS A QUALITY INDICATOR FOR IMAGING-BASED OVERLAY MEASUREMENTS

(71) Applicant: KLA Corporation, Milpitas, CA (US)

(72) Inventors: Gil Drachuck, Hillsboro, OR (US); Tom Leviant, Yoqneam Illit (IL); David Gready, Tel Aviv (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/014,940

(22) Filed: Sep. 8, 2020

(65) Prior Publication Data

US 2021/0080839 A1    Mar. 18, 2021

Related U.S. Application Data

(60) Provisional application No. 62/901,652, filed on Sep. 17, 2019.

(51) Int. Cl.
*G03F 7/20* (2006.01)

(52) U.S. Cl.
CPC ...... *G03F 7/70633* (2013.01); *G03F 7/70641* (2013.01)

(58) Field of Classification Search
CPC .......................... G03F 7/70633; G03F 7/70641
USPC ................................................ 355/52, 53, 55
See application file for complete search history.

(56) References Cited

U.S. PATENT DOCUMENTS

| | | | |
|---|---|---|---|
| 7,541,201 B2 | 6/2009 | Ghinovker | |
| 7,557,921 B1 * | 7/2009 | Adel | G03F 1/44 356/401 |
| 8,330,281 B2 | 12/2012 | Ghinovker et al. | |
| 9,214,317 B2 | 12/2015 | Shur | |
| 9,476,698 B2 | 10/2016 | Abdulhalim et al. | |
| 10,190,979 B2 | 1/2019 | Manassen et al. | |

(Continued)

FOREIGN PATENT DOCUMENTS

WO    2018004511 A1    1/2018

OTHER PUBLICATIONS

PCT International Search Report and Written Opinion for International Application No. PCT/US2020/050972 dated Dec. 18, 2020, 12 pages.

*Primary Examiner* — Hung Nguyen
(74) *Attorney, Agent, or Firm* — Suiter Swantz pc llo

(57) ABSTRACT

An image-based overlay metrology system is disclosed. The system includes a controller couplable to a metrology sub-system. The controller is configured to receive a set of image signals of a first metrology target disposed on the sample from the metrology sub-system and determine a plurality of harmonic detectivity metric values by calculating a harmonic detectivity metric value for each of the plurality of image signals. The controller is also configured to identify a set of optical measurement conditions of the metrology sub-system based on the plurality of harmonic detectivity metric values, wherein the set of optical measurement conditions define a recipe for optical metrology measurements of the metrology sub-system. The controller then provides the recipe to the metrology sub-system for execution of one or more optical metrology measurements of one or more additional metrology targets.

20 Claims, 6 Drawing Sheets

(56) References Cited

U.S. PATENT DOCUMENTS

| | | |
|---|---|---|
| 10,527,951 B2 | 1/2020 | Yohanan et al. |
| 2005/0160394 A1 | 7/2005 | Bevis |
| 2013/0035888 A1* | 2/2013 | Kandel ................... G03F 1/48 |
| | | 702/81 |
| 2014/0136137 A1* | 5/2014 | Tarshish-Shapir .......................... |
| | | G01N 21/4788 |
| | | 702/108 |
| 2016/0042105 A1 | 2/2016 | Adel et al. |
| 2017/0052454 A1* | 2/2017 | Jak ..................... G03F 7/70633 |
| 2019/0049861 A1* | 2/2019 | Van Voorst ......... G03F 7/70616 |

* cited by examiner

SYSTEM AND METHOD FOR APPLICATION OF HARMONIC DETECTIVITY AS A QUALITY INDICATOR FOR IMAGING-BASED OVERLAY MEASUREMENTS

CROSS-REFERENCE TO RELATED APPLICATION

The present application claims the benefit under 35 U.S.C. § 119(e) of U.S. Provisional Application Ser. No. 62/901,652, filed Sep. 17, 2019, which is incorporated herein by reference in the entirety.

TECHNICAL FIELD

The present disclosure relates generally to imaging overlay metrology and, more particularly, to the quantification of image-based optical signals using a harmonic detectivity metric.

BACKGROUND

Shrinking design rules and more demanding specifications for overlay metrology are driving increased demands for the sensitivity and robustness of overlay metrology methods. Overlay metrology is typically performed by fabricating dedicated metrology targets having fabricated features in multiple sample layers of interest. Image-based overlay metrology may typically include determining misregistration between two or more layers on a sample based on relative imaged positions of features of an overlay target in the different layers of interest. The accuracy of the overlay measurement may be sensitive to image quality associated with imaged features on each sample layer, which may vary based on various parameters associated with the illumination and sample in question. Accordingly, prior to measurement of overlay metrology targets, the metrology tool is configured in a selected recipe, which includes the various configurations of the metrology to be used for the given metrology measurement.

The current method for recipe selection relies on using either optical contrast, or through a combination of several metrics, which characterize different aspects of the measurement quality as a function of measurement focus and wavelength. These metrics are normalized and combined into a single fused score. The current method for recipe selection has shortcomings. First, the selection of metrics that are combined into a single score is subjective and relies on a user's decision regarding which metrics to use and how the metrics should be weighted and normalized. Second, since the metrics are normalized, their dynamic range for recipe differentiation is limited. This leads to score saturation and measurement condition ambiguity. Consequently, the current method of recipe selection may cause the selection of low quality or unstable recipes. Therefore, it would be desirable to provide a system and method for curing the shortcomings of the previous approaches such as those identified above.

SUMMARY

A metrology system is disclosed. In one embodiment, the system includes a controller couplable to a metrology sub-system, the controller including one or more processors configured to execute program instructions. In one embodiment, the one or more processors are configured to receive a plurality of image signals of a first metrology target disposed on the sample from the metrology sub-system. In another embodiment, the one or more processors are configured to determine a plurality of harmonic detectivity metric values by calculating a harmonic detectivity metric value for each of the plurality of image signals. In another embodiment, the one or more processors are configured to identify a set of optical measurement conditions of the metrology sub-system based on the plurality of harmonic detectivity metric values, wherein the set of optical measurement conditions define a recipe for optical metrology measurements of the metrology sub-system. In another embodiment, the one or more processors are configured to provide the recipe to the metrology sub-system for execution of one or more optical metrology measurements of one or more additional metrology targets. In one embodiment, the metrology sub-system includes an illumination source to generate illumination. In another embodiment, the metrology sub-system includes one or more illumination optics to direct illumination from the illumination source to a metrology target disposed on a sample. In another embodiment, the metrology sub-system includes a detector to generate an image of the metrology target based on the illumination from the illumination source, wherein an optical configuration of the metrology sub-system is configurable, wherein the optical configuration includes a wavelength of the illumination, a polarization of the illumination incident on the metrology target, an angle of the illumination incident on the metrology target, or a focal position of the metrology target with respect to the detector.

A method is disclosed. In one embodiment, the method includes receiving a plurality of image signals of a first metrology target disposed on a sample. In another embodiment, the method includes determining a plurality of harmonic detectivity metric values by calculating a harmonic detectivity metric value for each of the plurality of image signals. In another embodiment, the method includes identifying a set of optical measurement conditions of a metrology tool based on the plurality of harmonic detectivity metric values, wherein the set of optical measurement conditions define a recipe for optical metrology measurements of the metrology tool. In another embodiment, the method includes providing the recipe to the metrology tool for execution of one or more optical metrology measurements of one or more additional metrology targets.

A system for calibration is disclosed. In one embodiment, the system includes a controller couplable to a first metrology sub-system and a second metrology sub-system, the controller including one or more processors configured to execute program instructions. In one embodiment, the one or more processors are configured to receive a first set of image signals of one or more metrology targets disposed on the sample from the first metrology sub-system. In another embodiment, the one or more processors are configured to receive a second set of image signals of one or more metrology targets disposed on the sample from the second metrology sub-system. In another embodiment, the one or more processors are configured to determine a first set of harmonic detectivity metric values for the image signals from the first metrology sub-system. In another embodiment, the one or more processors are configured to determine a second set of harmonic detectivity metric values for the image signals from the second metrology sub-system. In another embodiment, the one or more processors are configured to compare the first set of harmonic detectivity metric values for the first metrology sub-system to the second set of harmonic detectivity metric values for the second metrology sub-system. In another embodiment, the one or more processors are configured to calibrate the second metrology sub-system based on the comparison of the first set of harmonic detectivity metric values for the first metrology sub-system to the second set of harmonic detectivity metric values for the second metrology sub-system.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
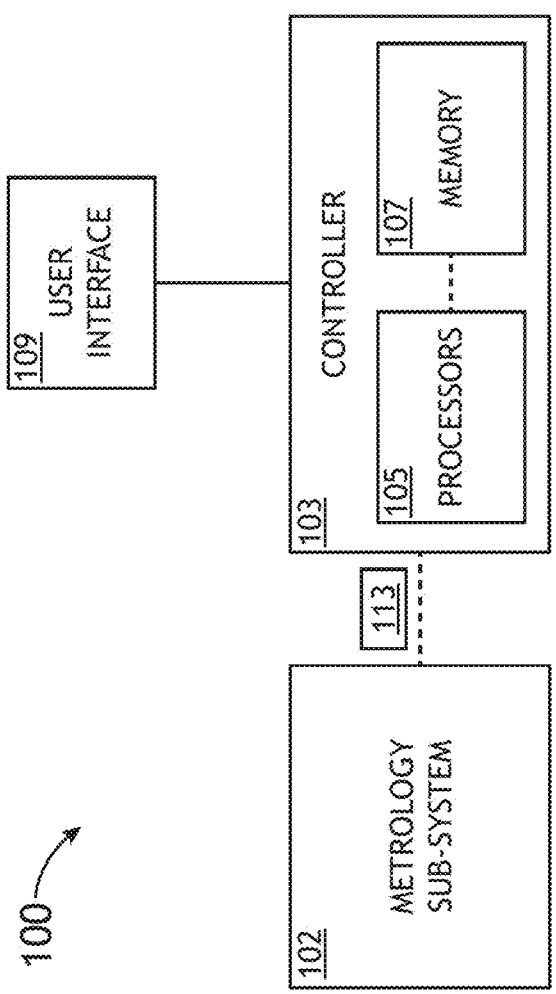
FIG. 1A is a conceptual view of an image-based optical metrology system with harmonic detectivity based recipe selection, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to the implementation of a Harmonic Detectivity Metric for imaging-based overlay metrology measurements. The Harmonic Detectivity Metric of the present disclosure allows for the quantification of an optical signal used for overlay misregistration detection. Additional embodiments of the present disclosure provide for the calibration of metrology tools using the Harmonic Detectivity Metric and the matching of overlay image data from multiple tools.

A semiconductor device may be formed as multiple printed layers of patterned material on a substrate. Each printed layer may be fabricated through a series of process steps such as, but not limited to, one or more material deposition steps, one or more lithography steps, or one or more etching steps. During fabrication, each printed layer must typically be fabricated within selected tolerances to properly construct the final device. For example, the relative placement of printed elements in each layer (e.g., the overlay or the overlay parameters) must be well characterized and controlled with respect to previously fabricated layers. Accordingly, metrology targets may be fabricated on one or more printed layers to enable efficient characterization of the overlay of the layers. Deviations of overlay target features on a printed layer may thus be representative of deviations of printed characteristics of printed device features on that layer. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

Metrology targets may typically include well-defined printed elements designed to provide an accurate representation of one or more printing characteristics. In this regard, measured characteristics of printed elements of a metrology target (e.g., by a metrology tool) may be representative of printed device elements associated with a device being fabricated.

Overlay metrology is typically performed by fabricating one or more overlay targets across a sample, where each overlay target includes features in sample layers of interest, which are fabricated at the same time as features associated with a device or component being fabricated. In this regard, overlay errors measured at a location of an overlay target may be representative of overlay errors of device features. Accordingly, overlay measurements may be used to monitor and/or control any number of fabrication tools to maintain production of devices according to specified tolerances. For example, overlay measurements of a current layer with respect to a previous layer on one sample may be utilized as feed-back data to monitor and/or mitigate deviations of the fabrication of the current layer on additional samples within a lot. By way of another example, overlay measurements of a current layer with respect to a previous layer on one sample may be utilized as feed-forward data to fabricate a subsequent layer on the same sample in a way that takes into account the existing layer alignments.

Overlay targets typically include features specifically designed to be sensitive to overlay errors between sample layers of interest. An overlay measurement may then be carried out by characterizing the overlay target using an overlay metrology tool and applying an algorithm to determine overlay errors on the sample based on the output of the metrology tool.

Regardless of the overlay measurement technique, an overlay metrology tool is typically configurable according to a recipe including a set of measurement parameters utilized to generate an overlay signal. For example, a recipe of an overlay metrology tool may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like. Accordingly, an overlay recipe may include a set of measurement parameters for generating an overlay signal suitable for determining overlay of two or more sample layers.

Overlay metrology tools may utilize a variety of techniques to determine the overlay of sample layers. For example, image-based overlay metrology tools may illuminate an overlay target (e.g., an advanced imaging metrology (AIM) target, a box-in-box metrology target, or the like) and capture an overlay signal including an image of overlay target features located on different sample layers. Accordingly, overlay may be determined by measuring the relative positions of the overlay target features.

It is recognized herein that various overlay metrology tools may be used to measure overlay. For example, optical metrology tools (e.g., light-based metrology tools using electromagnetic radiation for illumination and/or detection) may provide high-throughput overlay measurements using numerous techniques such as, but not limited to, determining relative positions of spatially-separated features on multiple layers in an image, directly measuring PPE on multiple layers, or scatterometry in which overlay is determined based on light scattered and/or diffracted from diffraction gratings on multiple layers. For the purposes of the present disclosure, the term "optical metrology tools," "optical metrology techniques," and the like indicate metrology tools and techniques using electromagnetic radiation of any wavelength such as, but not limited to, x-ray wavelengths, extreme ultraviolet (EUV) wavelengths, vacuum ultraviolet (VUV) wavelengths, deep ultraviolet (DUV) wavelengths, ultraviolet (UV) wavelengths, visible wavelengths, or infrared (IR) wavelengths. Systems, methods, and apparatuses related to overlay measurement are generally described in U.S. Pat. No. 8,330,281 titled "OVERLAY MARKS, METHODS OF OVERLAY MARK DESIGN AND METHODS OF OVERLAY MEASUREMENTS" and issued on Dec. 11, 2012, U.S. Pat. No. 9,476,698 titled "PERIODIC PATTERNS AND TECHNIQUE TO CONTROL MISALIGNMENT BETWEEN TWO LAYERS" and issued on Oct. 25, 2016, U.S. Pat. No. 7,541,201 titled "APPARATUS AND METHODS FOR DETERMINING OVERLAY OF STRUCTURES HAVING ROTATIONAL OR MIRROR SYMMETRY" and issued on Jun. 2, 2009, U.S. Patent Publication No. 2013/0035888 titled "METHOD AND SYSTEM FOR PROVIDING A QUALITY METRIC FOR IMPROVED PROCESS CONTROL" and published on Feb. 7, 2013, U.S. Pat. No. 9,214,317 titled "SYSTEM AND METHOD OF SEM OVERLAY METROLOGY" issued on Dec. 15, 2015, U.S. Pat. No. 10,527,951 B2 titled "COMPOUND IMAGING METROLOGY TARGETS" issued on Jan. 7, 2020, U.S. Pat. No. 10,190,979 B2 titled "METROLOGY IMAGING TARGETS HAVING REFLECTION-SYMMETRIC PAIRS OF REFLECTION-ASYMMETRIC STRUCTURES" issued on Jan. 29, 2019, and PCT Application No. PCT/US2016/039531 titled "APPARATUS AND METHOD FOR THE MEASUREMENT OF PATTERN PLACEMENT AND SIZE OF PATTERN AND COMPUTER PROGRAM THEREFOR" and filed on Jun. 27, 2016, all of which are incorporated herein by reference in their entirety.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1A is a conceptual view illustrating an image-based optical metrology system 100, in accordance with one or more embodiments of the present disclosure. The system 100 may include, but is not limited to, a metrology sub-system 102. The system 100 may additionally include, but is not limited to, a controller 103. The controller 103 may include one or more processors 105, a memory medium 107 and may include or be coupled to a user interface 109. The metrology sub-system 102 may include any metrology sub-system known in the art including, but not limited to, an optical metrology sub-system. For example, the metrology sub-system 102 may include, but is not limited to, an imaging-based optical metrology sub-system. For the purposes of the present disclosure, the term 'metrology system' is interchangeable with the term 'metrology tool.' In this sense, the metrology sub-system 102 and the controller 103 may form the metrology system 100 (or metrology tool).

The metrology sub-system 102 may be configured to acquire overlay signals from overlay targets based on any number of overlay recipes. The metrology sub-system 102 may operate in an imaging mode. For example, in an imaging mode, individual overlay target elements may be resolvable within the illuminated spot on the sample (e.g., as part of a bright-field image, a dark-field image, a phase-contrast image, or the like). In one embodiment, the metrology sub-system 102 may direct illumination to a sample and may further collect radiation emanating from the sample to generate an overlay signal suitable for the determination of overlay of two or more sample layers. The metrology sub-system 102 may be configurable to generate overlay signals based on any number of recipes defining measurement parameters for the acquiring an overlay signal suitable for determining overlay of an overlay target. For example, a recipe the metrology sub-system 102 may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, and the like.

The metrology sub-system 102 may include any type of optical metrology tool known in the art suitable for generating metrology data from an overlay metrology target. For example, the metrology sub-system 102 may be configured for measuring overlay metrology signals from one or more of an advanced imaging metrology (AIM) target, an advanced imaging metrology in-die (AIMid) target, a triple advanced imaging metrology (Triple AIM) target, a Box-In-Box (BiB) target, and the like.

In one embodiment, the controller 103 is communicatively coupled to the metrology sub-system 102. In one embodiment, the controller 103 is configured to generate and provide one or more control signals configured to perform one or more adjustments to one or more portions of the one or more metrology sub-systems 102. In another embodiment, the controller 103 is configured to receive image data from the metrology sub-system 102. The one or more processors 105 of controller 103 may execute any of the various process steps described throughout the present disclosure.

In one embodiment, the controller 103 is configured to receive a plurality of image signals of a first metrology target disposed on the sample 111 from the metrology sub-system 102. In another embodiment, the controller 103 is configured to determine a plurality of harmonic detectivity metric values by calculating a harmonic detectivity metric value for each of the plurality of image signals. In another embodiment, the controller 103 is configured to identify a set of optical measurement conditions of the metrology sub-system based on the plurality of harmonic detectivity metric values, wherein the set of optical measurement conditions define a recipe for optical metrology measurements of the metrology sub-system. In another embodiment, the controller 103 is configured to provide the recipe to the metrology sub-system 102 for execution of one or more optical metrology measurements of one or more additional metrology targets (e.g., targets on subsequent samples).

Figure 1B:
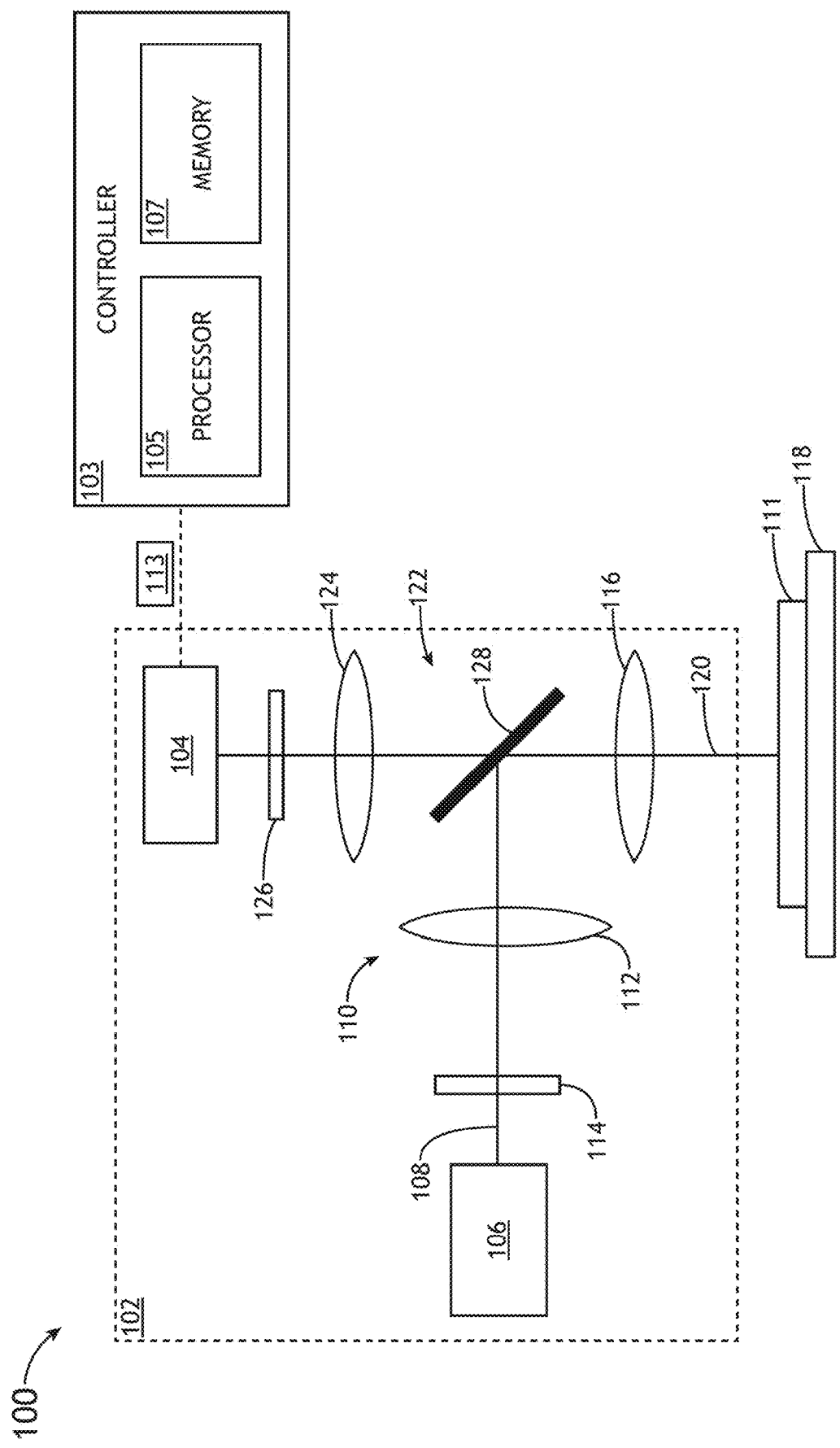
FIG. 1B is a block diagram view of an image-based optical metrology system, in accordance with one or more embodiments of the present disclosure.

FIG. 1B illustrates a simplified schematic view of the image-based overlay metrology system 100, in accordance with one or more embodiments of the present disclosure. The metrology system 100 may generate one or more images of a one or more overlay metrology targets of sample 111 on at least one detector 104 using any method known in the art.

In one embodiment, the metrology system 100 includes an illumination source 106 to generate an illumination beam 108. The illumination beam 108 may include one or more selected wavelengths of light including, but not limited to, vacuum ultraviolet radiation (VUV), deep ultraviolet radiation (DUV), ultraviolet (UV) radiation, visible radiation, or infrared (IR) radiation. The illumination source 106 may further generate an illumination beam 108 including any range of selected wavelengths. In another embodiment, the illumination source 106 may include a spectrally-tunable illumination source to generate an illumination beam 108 having a tunable spectrum.

The illumination source 106 may further produce an illumination beam 108 having any temporal profile. For example, the illumination source 106 may produce a continuous illumination beam 108, a pulsed illumination beam 108, or a modulated illumination beam 108. Additionally, the illumination beam 108 may be delivered from the illumination source 106 via free-space propagation or guided light (e.g. an optical fiber, a light pipe, or the like).

In another embodiment, the illumination source 106 directs the illumination beam 108 to a sample 111 via an illumination pathway 110. The illumination pathway 110 may include one or more lenses 112 or additional illumination optical components 114 suitable for modifying and/or conditioning the illumination beam 108. For example, the one or more illumination optical components 114 may include, but are not limited to, one or more polarizers, one or more filters, one or more beam splitters, one or more diffusers, one or more homogenizers, one or more apodizers, one or more beam shapers, or one or more shutters (e.g., mechanical shutters, electro-optical shutters, acousto-optical shutters, or the like). By way of another example, the one or more illumination optical components 114 may include aperture stops to control the angle of illumination on the sample 111 and/or field stops to control the spatial extent of illumination on the sample 111. In another embodiment, the metrology system 100 includes an objective lens 116 to focus the illumination beam 108 onto the sample 111.

In another embodiment, the sample 111 is disposed on a sample stage 118. The sample stage 118 may include any device suitable for positioning the sample 111 within the metrology system 100. For example, the sample stage 118 may include any combination of linear translation stages, rotational stages, tip/tilt stages or the like.

In another embodiment, a detector 104 is configured to capture radiation emanating from the sample 111 (e.g., sample light 120) through a collection pathway 122. For example, the collection pathway 122 may include, but is not required to include, a collection lens (e.g. the objective lens 116 as illustrated in FIG. 1) or one or more additional collection pathway lenses 124. In this regard, a detector 104 may receive radiation reflected or scattered (e.g. via specular reflection, diffuse reflection, and the like) from the sample 111 or generated by the sample 111 (e.g. luminescence associated with absorption of the illumination beam 108, or the like).

The collection pathway 122 may further include any number of collection optical components 126 to direct and/or modify illumination collected by the objective lens 116 including, but not limited to one or more collection pathway lenses 124, one or more filters, one or more polarizers, or one or more beam blocks. Additionally, the collection pathway 122 may include field stops to control the spatial extent of the sample imaged onto the detector 104 or aperture stops to control the angular extent of illumination from the sample used to generate an image on the detector 104. In another embodiment, the collection pathway 122 includes an aperture stop located in a plane conjugate to the back focal plane of an optical element of the objective lens 116 to provide telecentric imaging of the sample. In one embodiment, the metrology sub-system 102 includes a beamsplitter 128 oriented such that the objective lens 116 may simultaneously direct the illumination beam 108 to the sample 111 and collect radiation emanating from the sample 111.

The detector 104 may include any type of optical detector known in the art suitable for measuring illumination received from the sample 111. For example, the detector 104 may include, but is not limited to, a CCD detector, a TDI detector, a photomultiplier tube (PMT), an avalanche photodiode (APD), a complementary metal-oxide-semiconductor (CMOS) sensor, or the like. In another embodiment, the detector 104 may include a spectroscopic detector suitable for identifying wavelengths of light emanating from the sample 111.

The one or more processors 105 of a controller 103 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 105 may include any device configured to execute algorithms and/or instructions (e.g., program instructions stored in memory). In one embodiment, the one or more processors 105 may be embodied as a desktop computer, mainframe computer system, workstation, image computer, parallel processor, networked computer, or any other computer system configured to execute a program configured to operate or operate in conjunction with the metrology system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 103 may include one or more controllers housed in a common housing or within multiple housings. In this way, any controller or combination of controllers may be separately packaged as a module suitable for integration into metrology system 100. Further, the controller 103 may analyze data received from the detector 104 and feed the data to additional components within the metrology system 100 or external to the metrology system 100

The memory medium 107 may include any storage medium known in the art suitable for storing program instructions executable by the associated one or more processors 105. For example, the memory medium 107 may include a non-transitory memory medium. By way of another example, the memory medium 107 may include, but is not limited to, a read-only memory (ROM), a random-access memory (RAM), a magnetic or optical memory device (e.g., disk), a magnetic tape, a solid-state drive and the like. It is further noted that memory medium 107 may be housed in a common controller housing with the one or more processors 105. In one embodiment, the memory medium 107 may be located remotely with respect to the physical location of the one or more processors 105 and controller 103. For instance, the one or more processors 105 of controller 103 may access a remote memory (e.g., server), accessible through a network (e.g., internet, intranet and the like).

In one embodiment, a user interface is communicatively coupled to the controller 103. In one embodiment, the user interface 109 may include, but is not limited to, one or more desktops, laptops, tablets, and the like. In another embodiment, the user interface 109 includes a display used to display data of the system 100 to a user. The display of the user interface 109 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 109 is suitable for implementation in the present disclosure. In another embodiment, a user may input selections and/or instructions responsive to data displayed to the user via a user input device of the user interface 109.

In one embodiment, after acquiring one or more image signals from one or more first metrology targets of sample 111, the controller 103 may determine or calculate a set of Harmonic Detectivity Metric values. In doing so, the controller 103 may calculate a Harmonic Detectivity Metric value for each of the image signals 113 received from metrology sub-system 102. In one embodiment, a respective Harmonic Detectivity Metric value of a respective image signal 113 is a function of the Harmonic Signal Intensity of, the Anharmonic Noise, and Surface Reflectivity extracted from the image signal of the first metrology target of the sample 111. The Harmonic Detectivity Metric of the present disclosure is the combination (i.e., geometric mean) of two physical figures of merit that describe the response of the overlay targets to coherent illumination ('harmonic ratio') and signal-to-noise ratio of the collected light emitted from the overlay target ('detectivity'). The Harmonic Detectivity Metric may be defined as follows:

$$\text{Harmonic Detectivity} = \sqrt{\text{HarmonicSensitivity} \times \text{Detectivity}} \qquad \text{Eq. 1}$$

where Harmonic Detectivity associated with the signal 113 may be expressed as a function of Harmonic Sensitivity and Detectivity of the signal 113. Harmonic Sensitivity may be related to Harmonic Signal Intensity of the signal 113 and Surface Reflectivity of the target as follows:

$$\text{Harmonic Sensitivty} = \frac{\text{Harmonic Signal Intensity}}{\text{Surface Reflectivity}} \qquad \text{Eq. 2}$$

where Detectivity is related to the Harmonic Signal Intensity and Anharmonic Noise of the signal 113 as follows:

$$\text{Detectivity} = \frac{\text{Harmonic Signal Intensity}}{\text{Anharmonic Noise}} \qquad \text{Eq. 3}$$

Consequently, combining Eq. 1-Eq. 3 provides:

$$\text{Harmonic Detectivity} = \frac{\text{Harmonic Signal Intensity}}{\sqrt{\text{Anharmonic Noise}} \sqrt{\text{Surface Reflectivity}}} \qquad \text{Eq. 4}$$

The signal that is recorded by the metrology system 100 is an image of a period structure or grating (i.e., overlay metrology target), which is then used to extract overlay information. The image of the grating may be integrated along the non-periodic direction, which produces a one-dimensional image 'kernel.' The measured image kernel is periodic and may undergo Fourier decomposition. Following decomposition, the signal may then be represented by a constant offset and by a sum of sine and cosine terms, each multiplied by its own coefficient (i.e., the synthetic kernel). In one embodiment, the 'Harmonic Signal Intensity' is calculated as the sum of all harmonic coefficients of the Fourier decomposition. The Surface Reflectivity may represent the constant offset of the kernel. The Anharmonic Noise may represent the variation of the difference between the measured image kernel and the synthetic image kernel, or the "residual noise."

The Harmonic Detectivity of Eq. 4 is a fundamental physical merit which can be derived from raw measured signals 109 and may be interpreted as the interaction between the metrology sub-system 102, the layer of the sample (e.g., process layer in semiconductor device), and the overlay target being examined.

It is noted that the harmonic detectivity does not saturate and, therefore, provides unlimited dynamic range and allows for optimal recipe condition selection. In this sense, The Harmonic Detectivity is a quantified measure of the harmonic signal measurement associated with a particular measurement configuration of the metrology sub-system 102 during image-based overlay metrology measurements. This is in contrast to the currently implemented scheme, whereby derivative metrics are recombined into a single score and are prone to user bias.

In another embodiment, the controller 103 is configured to identify a set of optical measurement conditions of the metrology sub-system 102 based on the harmonic detectivity metric values, which represent a preferred 'recipe' for image-based overlay measurements. In this regard, the controller 103 (or another computer system) may identify the set of optical measurement conditions, which are optimum or at least satisfactory, in order to define a recipe for optical metrology measurements of the metrology sub-system 102. Then, the controller 103 may provide the recipe to the metrology sub-system 102 for execution of one or more optical metrology measurements of one or more additional metrology targets (e.g., targets on subsequent samples).

Figure 2:
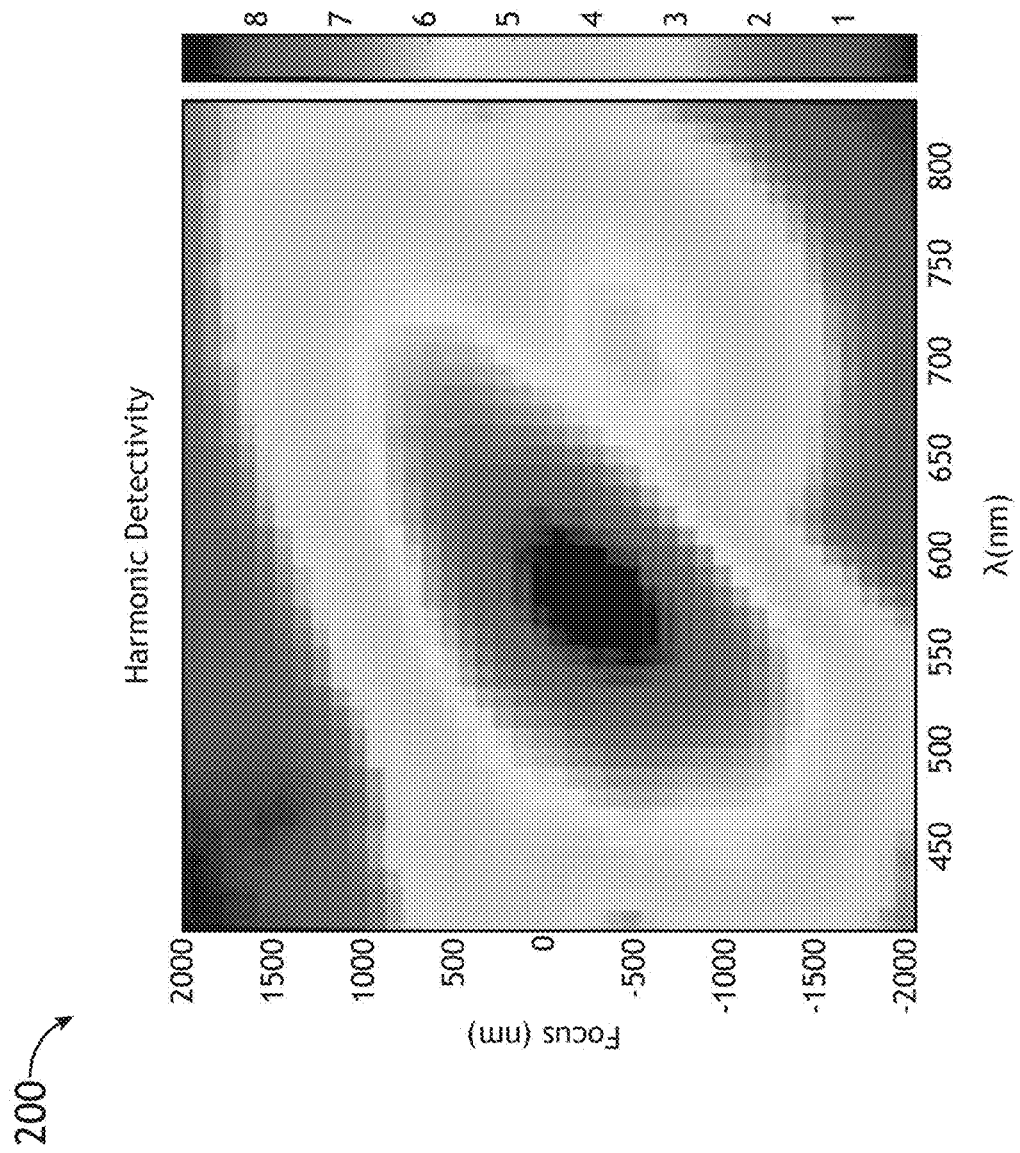
FIG. 2 is a contour plot depicting the harmonic detectivity metric displayed as a function of illumination wavelength and focus, in accordance with one or more embodiments of the present disclosure.

In order to identify the set of optimal (or satisfactory) recipe conditions, the controller 103 may determine the value of the Harmonic Detectivity Metric values at different sets of optical measurement conditions, effectively mapping the harmonic detectivity across the parameter space in question. For example, the controller 103 may determine a value of the Harmonic Detectivity Metric across different sets of focus and wavelength values (or any other set of metrology sub-system/tool settings) for the metrology sub-system 102. It is noted that the value of the Harmonic Detectivity Metric of a respective image signal 113 acquired from a given metrology target is monotonically dependent on Harmonic Signal Intensity, the Anharmonic Noise, and Surface Reflectivity of associated with the image signal 113. As a result, the higher the value of the Harmonic Detectivity Metric the better the quality of the particular overlay signal is for measuring overlay for the given target type. In one embodiment, a recipe for the metrology sub-system 102 may be acquired by ranking each of set of measurement conditions (e.g., wavelength and focus) based on the value of the corresponding Harmonic Detectivity Metrics. In this regard, the set of optical conditions displaying the highest Harmonic Detectivity Metric values represents the 'best' conditions and suitable for implementation in the candidate recipe for the metrology sub-system 102. FIG. 2 is a contour plot depicting Harmonic Detectivity Metric values calculated for signals 109 from a respective overlay target and displayed as a function of illumination wavelength and focus of the metrology sub-system 102. The candidate recipes may be selected based on the local maximums of the plot, where only one measurement condition per peak or 'island' (at the local maximum value of the plot) are considered as a unique candidate recipe. It is noted that the contour plot of FIG. 2 includes two local maxima, one at approximately $\lambda=570$ nm and focus of $-50$ nm and another at approximately $\lambda=710$ nm and focus of $-500$ nm. In this example, both of these conditions may be selected as the candidate recipe.

Figure 3:
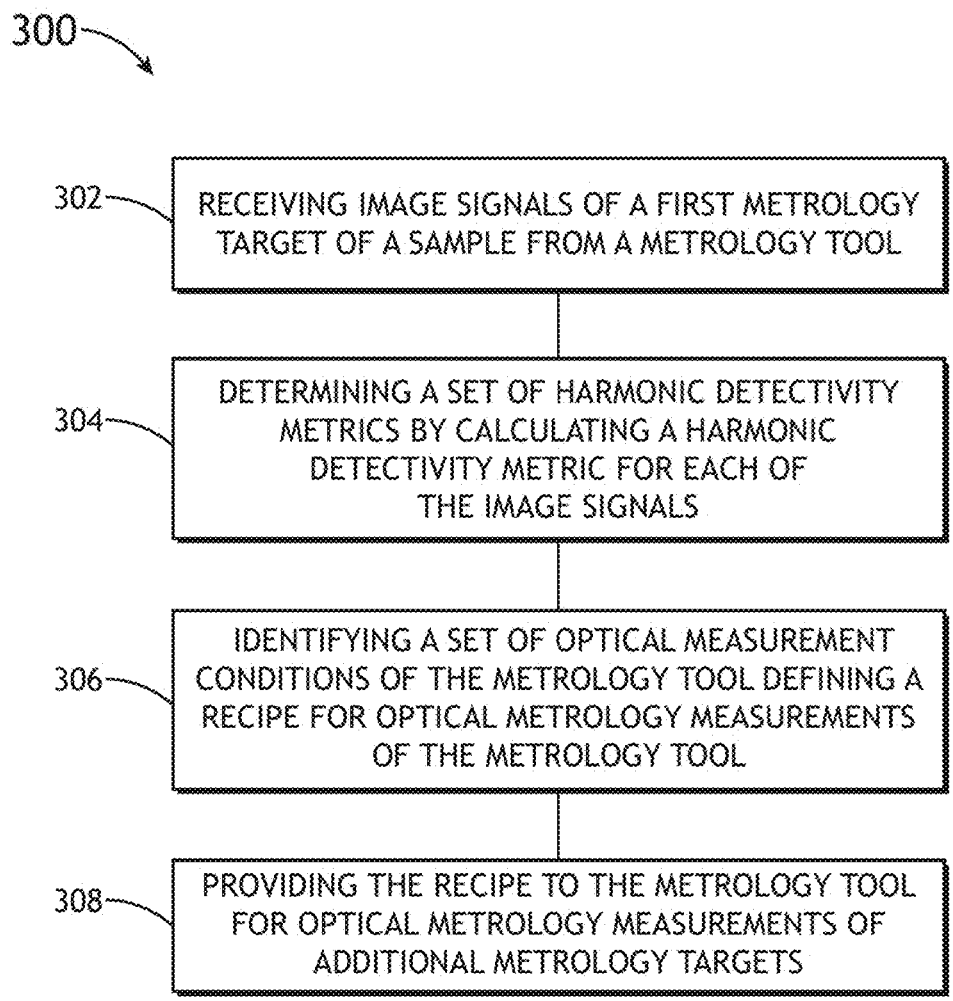
FIG. 3 is flow diagram depicting a method of harmonic detectivity based recipe selection, in accordance with one or more embodiments of the present disclosure.

FIG. 3 is a flow diagram depicting a method 300 of applying a harmonic detectivity metric to identify an image-based overlay metrology recipe of a metrology tool, in accordance with one or more embodiments of the present disclosure. Applicant notes that the embodiments and enabling technologies described previously herein in the context of the metrology system 100 should be interpreted to extend to the method 300. It is further noted, however, that the method 300 is not limited to the architecture of the metrology system 100.

In step 302, the method 300 receives a set of image signals of a first metrology target disposed on the sample from the metrology sub-system (or tool) 102. For example, the metrology sub-system 102 may acquire image data from a first metrology target (or a first set of metrology targets) and transmit a signal indicative of the image data to one or more processors 105 of controller 103.

In step 304, the method 300 determines a set of harmonic detectivity metric values by calculating a harmonic detectivity metric value for each of the set of image signals. For example, the one or more processors 105 of the controller 103 may execute program instructions in memory medium 107, which calculate harmonic detectivity values for each of a set of conditions (e.g., wavelength, focus, etc.) using Eq. 4 previously described herein. The conditions analyzed may include, but are not limited to, polarization of the image-form beam, an angle of illumination, focus or focal position of the metrology target, wavelength, polarization, and the like.

In step 306, the method 300 identifies a set of optical measurement conditions of the metrology sub-system 10 based on the set of harmonic detectivity metric values. In this sense, the set of optical measurement conditions define a recipe for optical metrology measurements of the metrology sub-system 102. For example, the one or more processors 105 of the controller 103 may rank the calculate harmonic detectivity metric values (e.g., from highest to lowest) and then identify the set of conditions corresponding with one or more of the highest signals. The set of conditions that produce the highest harmonic detectivity metric values represent suitable conditions for incorporation into an overlay metrology recipe.

In step 308, the method provides the identified recipe to the metrology sub-system 102 for execution of one or more optical metrology measurements of one or more additional metrology targets of the sample 111. For example, the one or more processors 105 of the controller 103 may direct the metrology sub-system 102 to carry out additional image-based overlay measurements on the sample or additional samples using the recipe identified in step 306.

While much of the present disclosure has been focused on the development and application of the Harmonic Detectivity Metric in the context of optimal recipe identification, it is noted that the Harmonic Detectivity Metric may be used to calibrate metrology tools and match/combine image-based metrology data from multiple tools.

Figure 4:
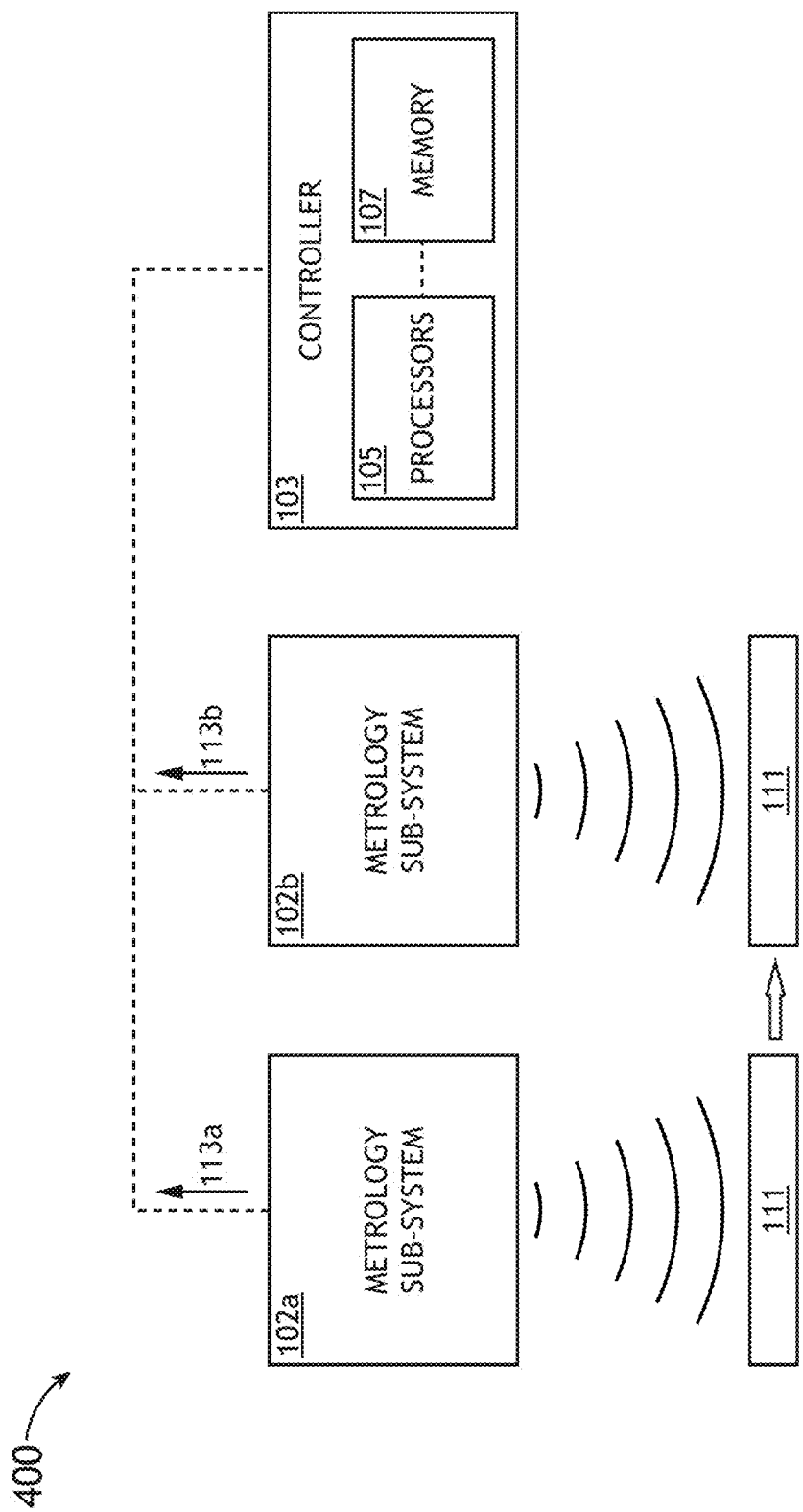
FIG. 4 is a block diagram view of a system including multiple metrology sub-systems configured for calibration via a harmonic detectivity metric, in accordance with one or more embodiments of the present disclosure.

FIG. 4 illustrates a block diagram view of a system 400 including multiple metrology sub-systems configured for calibration via a Harmonic Detectivity Metric. Since the Harmonic Detectivity Metric of the present disclosure only depends on the metrology sub-system/tool in question and the sample/overlay target combination, the Harmonic Detectivity Metric may be leveraged to perform tool calibration and/or matching of image-based metrology data by comparing Harmonic Detectivity Metric landscape data (similar to FIG. 2) measured on the same sample (e.g., wafer), but on different tools. Such a calibration may be carried out during tool production and in the field.

In one embodiment, the controller 103 receives image signals of one or more metrology targets disposed on the sample from the first metrology sub-system 102a. Then, the controller 103 may determine/calculate a first set of harmonic detectivity metric values for corresponding with the image signals from the first metrology sub-system 102a.

In another embodiment, the controller 103 receives image signals of one or more metrology targets disposed on the sample 111 (same sample as measured by first metrology sub-system 102a) from the second metrology sub-system. The controller 103 may then determine a second set of harmonic detectivity metric values corresponding with the image signals from the second metrology sub-system 102b.

In another embodiment, the controller 103 compares the first set of harmonic detectivity metric values for the first metrology sub-system 102a to the second set of harmonic detectivity metric values for the second metrology subsystem 102. This comparison may be carried out in any way suitable for contour map comparison. In this regard, the controller 103 may compare a landscape map of the first set of harmonic metric values, which are mapped as a function of two or more conditions (e.g., focus and wavelength) to a landscape map of the second set of harmonic metric values, which are also mapped as a function the two or more conditions (e.g., focus and wavelength). In this embodiment, the comparison may include subtraction of the individual values of the maps to identify a 'difference map'.

In another embodiment, the controller 103 may calibrate the second metrology sub-system based on the comparison of the first set of harmonic detectivity metric values to the second set of harmonic detectivity metric values. For example, the controller 103 may provide control instructions to the second metrology sub-system 102b (assuming the first metrology sub-system is well calibrated) to adjust or tune one or more conditions (e.g., focus, wavelength, angle of incidence, polarization, etc.) of the second metrology sub-system 102b until the difference in landscape maps is within a selected threshold difference.

In another embodiment, the controller 103 may adjust image-based overlay metrology data acquired with the second metrology sub-system 102b based on the comparison of the first set of harmonic detectivity metric values to the second harmonic detectivity metric values. In another embodiment, the controller 103 may combine image-based overlay metrology data from the first metrology sub-system with calibrated image-based overlay metrology data from the second metrology sub-system 102b in order to 'match' images from the two metrology sub-system 102a, 102b.

Figure 5:
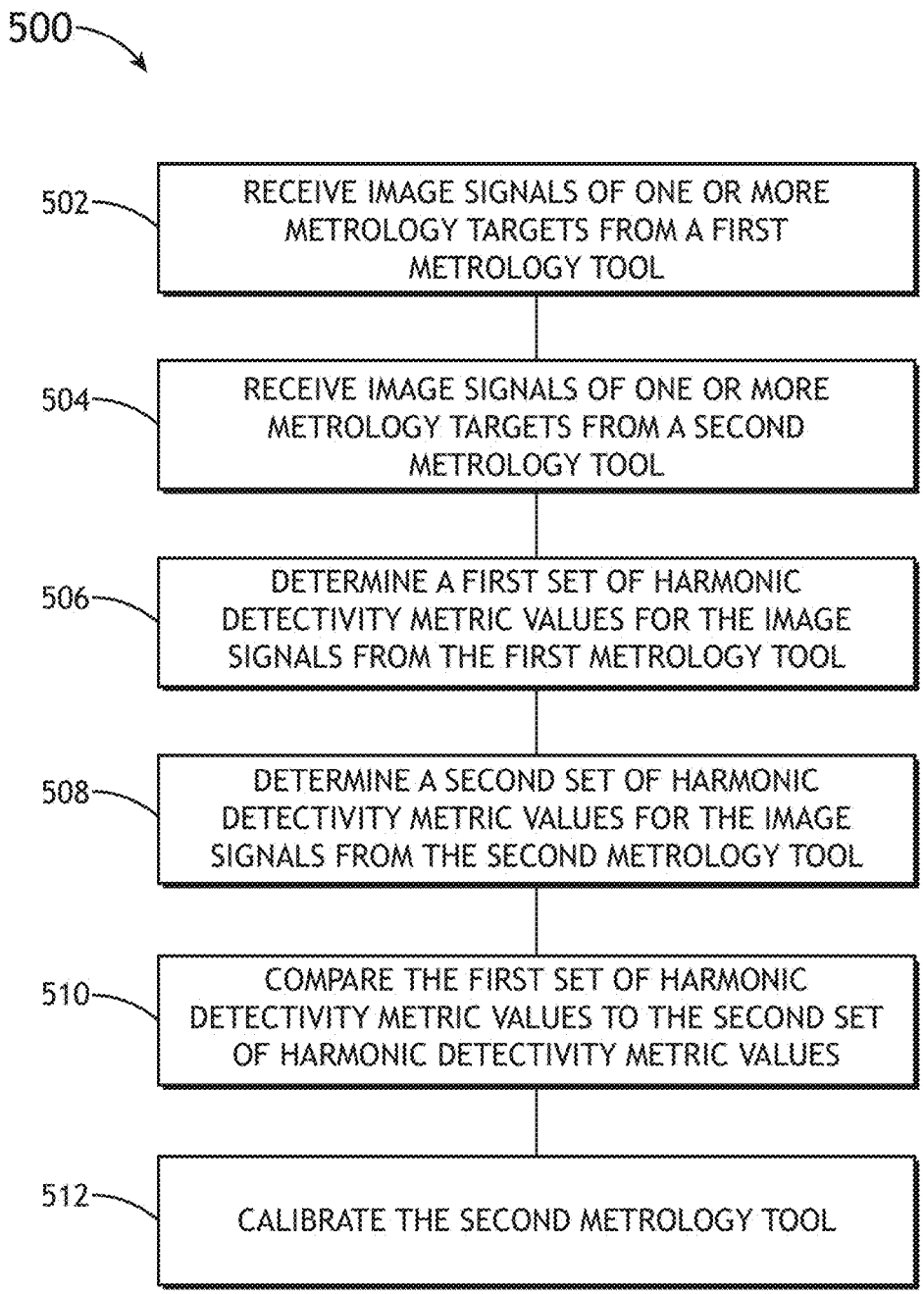
FIG. 5 is a flow diagram depicting a method of calibrating a metrology sub-system/tool with a harmonic detectivity metric, in accordance with one or more embodiments of the present disclosure

FIG. 5 is a flow diagram depicting a method 500 of calibrating a metrology sub-system/tool with a harmonic detectivity metric, in accordance with one or more embodiments of the present disclosure. Applicant notes that the embodiments and enabling technologies described previously herein in the context of the metrology system 100 should be interpreted to extend to the method 500. It is further noted, however, that the method 500 is not limited to the architecture of the metrology system 100.

In step 502, the method 500 include receive a first set of image signals 113a of one or more metrology targets disposed on the sample 111 from the first metrology sub-system 102a. In step 504, the method 500 includes receiving a second set of image signals 113b of one or more metrology targets disposed on the sample 111 from the second metrology sub-system 102b. In step 506, the method 500 include determining a first set of harmonic detectivity metric values for the image signals 113a from the first metrology sub-system 102a. In step 508, the method 500 includes determining a second set of harmonic detectivity metric values for the image signals 113b from the second metrology sub-system 102b. In step 510, the method 500 includes comparing the first set of harmonic detectivity metric values for the first metrology sub-system 102a to the second set of harmonic detectivity metric values for the second metrology sub-system 102b. In step 512, the method 500 includes calibrating the second metrology sub-system 102b based on the comparison of the first set of harmonic detectivity metric values for the first metrology sub-system 102a to the second set of harmonic detectivity metric values for the second metrology sub-system 102b.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
   a controller couplable to a metrology sub-system, the controller including one or more processors configured to execute program instructions causing the one or more processors to:
   receive a plurality of image signals of a first metrology target disposed on a sample from the metrology sub-system;
   determine a plurality of harmonic detectivity metric values by calculating a harmonic detectivity metric value for each of the plurality of image signals, wherein a respective harmonic detectivity metric value of a respective image signal is a function of harmonic signal intensity of the respective image signal, anharmonic noise of the respective image signal, and surface reflectivity of the first metrology target;
   identify a set of optical measurement conditions of the metrology sub-system based on the plurality of harmonic detectivity metric values, wherein the set of optical measurement conditions define a recipe for optical metrology measurements of the metrology sub-system; and
   provide the recipe to the metrology sub-system for execution of one or more optical metrology measurements of one or more additional metrology targets.

2. The metrology of claim 1, wherein the respective harmonic detectivity metric value of a respective image signal is monotonically dependent on the harmonic signal intensity of the respective image signal, the anharmonic noise of the respective image signal, and the surface reflectivity of the first metrology target.

3. The metrology system of claim 2, wherein the respective harmonic detectivity metric value of the respective image signal is defined by:

$$\text{Harmonic Detectivity Metric} = \frac{\text{Harmonic Signal Intensity}}{\sqrt{\text{Anharmonic Noise}} \sqrt{\text{Surface Relectivity}}}$$

4. The metrology system of claim 1, wherein the one or more processors are configured to determine each of the harmonic detectivity metric values at a different set of optical measurement conditions.

5. The metrology system of claim 1, wherein the one or more processors are configured to determine each of the harmonic detectivity metric values at a different set of focus and wavelength values.

6. The metrology system of claim 1, wherein the one or more processors are configured to display the set of harmonic detectivity metric values as a function of two or more optical measurement conditions.

7. The metrology system of claim 6, wherein the one or more processors are configured to display the set of harmonic detectivity metric values as a function of focus and wavelength.

8. The metrology system of claim 1, wherein the set of optical conditions defining the recipe for optical metrology measurements of the metrology sub-system comprises:
   two or more of a wavelength of illumination, a polarization of the illumination incident on a metrology target, an angle of the illumination incident on the metrology target, or a focal position of the metrology target with respect to a detector.

9. A metrology system comprising:
a metrology sub-system, wherein the metrology sub-system comprises:
an illumination source to generate illumination;
one or more illumination optics to direct the illumination from the illumination source to a metrology target disposed on a sample; and
a detector to generate an image of the metrology target based on the illumination from the illumination source, wherein an optical configuration of the metrology sub-system is configurable, wherein the optical configuration includes a wavelength of the illumination, a polarization of the illumination incident on the metrology target, an angle of the illumination incident on the metrology target, or a focal position of the metrology target with respect to the detector; and
a controller couplable to the metrology sub-system, the controller including one or more processors configured to execute program instructions causing the one or more processors to:
receive a plurality of image signals of a first metrology target disposed on the sample from the metrology sub-system;
determine a plurality of harmonic detectivity metric values by calculating a harmonic detectivity metric value for each of the plurality of image signals, wherein a respective harmonic detectivity metric value of a respective image signal is a function of harmonic signal intensity of the respective image signal, anharmonic noise of the respective image signal, and surface reflectivity of the first metrology target;
identify a set of optical measurement conditions of the metrology sub-system based on the plurality of harmonic detectivity metric values, wherein the set of optical measurement conditions define a recipe for optical metrology measurements of the metrology sub-system; and
provide the recipe to the metrology sub-system for execution of one or more optical metrology measurements of one or more additional metrology targets.

10. The metrology system of claim 9, wherein the respective harmonic detectivity metric value of the respective image signal is monotonically dependent on the harmonic signal intensity of the respective image signal, the anharmonic noise of the respective image signal, and the surface reflectivity of the first metrology target.

11. The metrology system of claim 10, wherein the respective harmonic detectivity metric value of the respective image signal is defined by:

$$\text{Harmonic Detectivity Metric} = \frac{\text{Harmonic Signal Intensity}}{\sqrt{\text{Anharmonic Noise}} \sqrt{\text{Surface Relectivity}}}$$

12. The metrology system of claim 9, wherein the one or more processors are configured to determine each of the harmonic detectivity metric values at a different set of optical measurement conditions.

13. The metrology system of claim 9, wherein the one or more processors are configured to determine each of the harmonic detectivity metric values at a different set of focus and wavelength values.

14. The metrology system of claim 9, wherein the one or more processors are configured to display the set of harmonic detectivity metric values as a function of two or more optical measurement conditions.

15. The metrology system of claim 14, wherein the one or more processors are configured to display the set of harmonic detectivity metric values as a function of focus and wavelength.

16. The metrology system of claim 9, wherein the set of optical conditions defining the recipe for optical metrology measurements of the metrology sub-system comprises:
two or more of a wavelength of illumination, a polarization of the illumination incident on the metrology target, an angle of the illumination incident on the metrology target, or a focal position of the metrology target with respect to the detector.

17. A metrology system comprising:
a controller couplable to a first metrology sub-system and a second metrology sub-system, the controller including one or more processors configured to execute program instructions causing the one or more processors to:
receive a first set of image signals of one or more metrology targets disposed on a sample from the first metrology sub-system;
receive a second set of image signals of one or more metrology targets disposed on the sample from the second metrology sub-system;
determine a first set of harmonic detectivity metric values for the image signals from the first metrology sub-system, wherein a respective harmonic detectivity metric value of the first set of harmonic detective metric values is a function of harmonic signal intensity of a first respective image signal of the first set of image signals, anharmonic noise of the first respective image signal, and surface reflectivity of a metrology target;
determine a second set of harmonic detectivity metric values for the image signals from the second metrology sub-system;
compare the first set of harmonic detectivity metric values for the first metrology sub-system to the second set of harmonic detectivity metric values for the second metrology sub-system; and
calibrate the second metrology sub-system based on the comparison of the first set of harmonic detectivity metric values for the first metrology sub-system to the second set of harmonic detectivity metric values for the second metrology sub-system.

18. The system of claim 17, wherein the one or more processors are further configured to:
adjust image-based overlay metrology data acquired with the second metrology sub-system based on the comparison of the one or more first harmonic detectivity metric values for the first metrology sub-system to the one or more second harmonic detectivity metric values for the second metrology sub-system.

19. The system of claim 18, wherein the one or more processors are further configured to:
combine image-based overlay metrology data from the first metrology sub-system with calibrated image-based overlay metrology data from the second metrology sub-system.

20. A method comprising:
receive a plurality of image signals of a first metrology target disposed on a sample;
determine a plurality of harmonic detectivity metric values by calculating a harmonic detectivity metric value for each of the plurality of image signals, wherein a respective harmonic detectivity metric value of a respective image signal is a function of harmonic signal intensity of the respective image signal, anharmonic noise of the respective image signal, and surface reflectivity of the first metrology target;
identify a set of optical measurement conditions of a metrology tool based on the plurality of harmonic detectivity metric values, wherein the set of optical measurement conditions define a recipe for optical metrology measurements of the metrology tool; and
provide the recipe to the metrology tool for execution of one or more optical metrology measurements of one or more additional metrology targets.

\* \* \* \* \*